(12) United States Patent
Lee et al.

(10) Patent No.: US 9,672,889 B2
(45) Date of Patent: Jun. 6, 2017

(54) SEMICONDUCTOR MEMORY DEVICE AND REFRESH CONTROL METHOD THEREOF

(71) Applicant: SK hynix Inc., Gyeonggi-do (KR)

(72) Inventors: Sung-Yub Lee, Gyeonggi-do (KR);
Sung-Soo Chi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/688,749

(22) Filed: Apr. 16, 2015

(65) Prior Publication Data

US 2016/0163372 A1 Jun. 9, 2016

(30) Foreign Application Priority Data

Dec. 8, 2014 (KR) .................... 10-2014-0174913

(51) Int. Cl.
*G11C 11/406* (2006.01)
*G11C 11/408* (2006.01)

(52) U.S. Cl.
CPC ........ *G11C 11/406* (2013.01); *G11C 11/4085* (2013.01)

(58) Field of Classification Search
CPC .................................................. G11C 11/406
USPC ........................................................ 365/222
See application file for complete search history.

(56) References Cited

U.S. PATENT DOCUMENTS

| 2005/0013185 | A1* | 1/2005 | Kim | ...................... | G11C 11/406 365/222 |
| 2011/0141836 | A1* | 6/2011 | Luthra | ................... | G11C 11/406 365/222 |
| 2012/0300568 | A1* | 11/2012 | Park | ................... | G11C 11/40618 365/222 |
| 2013/0051171 | A1* | 2/2013 | Porter | ...................... | G11C 8/08 365/222 |
| 2013/0159617 | A1* | 6/2013 | Yu | ........................... | G06F 12/00 711/106 |
| 2014/0359208 | A1* | 12/2014 | Song | ........................ | G11C 7/02 711/106 |
| 2014/0369109 | A1* | 12/2014 | Lee | ........................ | G11C 11/406 365/149 |
| 2015/0085564 | A1* | 3/2015 | Yoon | ................. | G11C 11/40611 365/149 |
| 2015/0155025 | A1* | 6/2015 | Lee | ................... | G11C 11/40618 365/222 |
| 2015/0170728 | A1* | 6/2015 | Jung | ........................ | G11C 8/08 365/222 |
| 2015/0235694 | A1* | 8/2015 | Kim | ................. | G11C 11/40626 365/222 |
| 2016/0019944 | A1* | 1/2016 | Jung | ...................... | G11C 29/76 365/200 |

(Continued)

FOREIGN PATENT DOCUMENTS

KR 1020150064953 6/2015

*Primary Examiner* — Anthan Tran
*Assistant Examiner* — Mushfique Siddique
(74) *Attorney, Agent, or Firm* — IP & T Group LLP

(57) ABSTRACT

A semiconductor memory device includes a memory bank including a plurality of word lines, and a refresh operation control unit suitable for performing a first refresh operation for a first adjacent word line group of a target word line of the plurality of word lines, and performing a second refresh operation for a second adjacent word line group of the target word line after the first refresh operation, in response to a smart refresh command.

14 Claims, 4 Drawing Sheets

(56) References Cited

U.S. PATENT DOCUMENTS

2016/0293243 A1* 10/2016 Joo .................... G11C 29/783
2016/0351248 A1* 12/2016 Jung ................. G11C 11/40618

* cited by examiner

SEMICONDUCTOR MEMORY DEVICE AND REFRESH CONTROL METHOD THEREOF

CROSS-REFERENCE TO RELATED APPLICATIONS

The present application claims priority of Korean Patent Application No. 10-2014-0174913, filed on Dec. 8, 2014, which is incorporated herein by reference in its entirety.

BACKGROUND

1. Field

Exemplary embodiments of the present invention relate to a semiconductor design technology and, more particularly, to a semiconductor memory device that performs a refresh operation.

2. Description of the Related Art

A semiconductor memory device includes a plurality of memory banks for storing data, wherein each of the plurality of memory banks includes tens of millions of memory cells. Each memory cell includes a cell capacitor and a cell transistor, and the semiconductor memory device stores data by charging and discharging the cell capacitor. Ideally, the amount of charge stored in the cell capacitor would always be always constant. However, in actuality, the amount of charge stored in the cell capacitor changes due to voltage differences between peripheral circuits. As time goes one, the charge of the cell capacitor may be lost. As described above, changes in the charge stored in the cell capacitor represents a change in the data stored in the cell capacitor, meaning the stored data may be corrupted of lost.

In order to prevent the aforementioned data loss, the semiconductor memory device performs a refresh operation.

With the development of process technology, the integration of semiconductor memory devices increases more and more, thereby influencing the size of the memory banks. A reduction in size of memory banks results in the intervals (or distance) between memory cells being reduced. Additionally, the intervals between word lines that are coupled to adjacent memory cells is reduced. As the intervals between word lines are reduced, new problems arise such as coupling effects between adjacent word lines. When the coupling effect occurs between adjacent word lines, the data stored in the memory cells that are coupled to the word lines may corrupted or lost. That is, there is a significant probability that the memory cells will lose their data.

To prevent such issues, a semiconductor memory device performs refresh operations for all memory cells of a memory bank. That is the number refresh operations may be increased to maintain data reliability at acceptable levels. However, an increase in the number of the refresh operations reduces the operational efficiency of the semiconductor memory device.

SUMMARY

Various embodiments are directed to a semiconductor memory device capable of preventing data loss caused by high integration in semiconductor memory devices by controlling refresh operations.

In an embodiment, a semiconductor memory device may include a memory bank including a plurality of word lines, and a refresh operation control unit suitable for performing a first refresh operation for a first adjacent word line group of a target word line of the plurality of word lines, and performing a second refresh operation for a second adjacent word line group of the target word line after the first refresh operation, in response to a smart refresh command.

Preferably, the first adjacent word line group may be a word line first adjacent to the target word line, and the second adjacent word line group may be a word line second adjacent to the target word line, among the plurality of word lines.

Preferably, the semiconductor memory device may further include a normal command generation unit suitable for generating a normal refresh command in response to a refresh command, and a smart command generation unit suitable for counting the refresh command and generating the smart refresh command whenever the refresh command is counted a first predetermined number of times, wherein the normal refresh command is deactivated when the smart refresh command is activated.

Preferably, the normal command generation unit may count a refresh command and generate a normal refresh command which is activated in each predetermined cycle.

Preferably, the smart command generation unit may count the refresh command to activate the smart refresh command for executing the first smart mode in each first predetermined cycle, and count the refresh command to activate the smart refresh command for executing the second smart mode in each second predetermined cycle.

Preferably, the refresh operation control unit sequentially may access the plurality of word lines in response to the normal refresh command.

Preferably, the refresh operation control unit may include a normal address generation section suitable for counting the normal refresh command and generating a normal refresh address, a target row information generation section suitable for receiving a bank address, a row command, and a roar address, and generating target row information on the target word line, a smart address generation section suitable for receiving the smart refresh command and the target row information and generating a first adjacent address for the first adjacent word line group or a second adjacent address for the second word line group, and a word line driving section suitable for driving word lines corresponding to the normal refresh address and the first and second adjacent addresses, among the plurality of word lines.

Preferably, the smart address generation section may include a counting part suitable for counting the smart refresh command and generating a control signal, an address latching part suitable for latching the target row information and outputting a latched address, and an address output part suitable for outputting a first adjacent address group of the latched address or a second adjacent address group of the latched address in response to the control signal.

Preferably, the counting part may count the smart refresh command and activate the control signal when the smart refresh command is counted a second predetermined number of times.

Preferably, the address output part may output the first adjacent address group when the control signal is deactivated and output the second adjacent address group when the control signal is activated.

In an embodiment, a semiconductor memory device may include a memory bank including a plurality of word lines, a smart command generation unit suitable for counting a refresh command and generating a smart refresh command which is activated in a predetermined cycle, and a refresh operation control unit suitable for counting the smart refresh command, performing a refresh operation for a first word line most adjacent to a target word line of the plurality of word lines for a predetermined number of times, and performing the refresh operation for a second word line second adjacent to the target word line after the predetermined number of times.

Preferably, the semiconductor memory device may further include a normal command generation unit suitable for generating a normal refresh command in response to the refresh command and deactivating the normal refresh command when the smart refresh command is activated.

Preferably, the refresh operation control unit may include: a normal address generation section suitable for counting the normal refresh command and generating a normal refresh address, a target row information generation section suitable for receiving a bank address, a row command, and a row address, and generating target row information on the target word line, a smart address generation section suitable for receiving the smart refresh command and the target row information and generating a first adjacent address for the first word line or a second adjacent address for the second word line, and a word line driving section suitable for driving word lines corresponding to the normal refresh address and the first and second adjacent addresses, among the plurality of word lines.

Preferably, the smart address generation section may include a counting part suitable for counting the smart refresh command and generating a control signal, an address latching part suitable for latching the target row information and outputting a latched address, and an address output part suitable for outputting a first adjacent address group of the latched address or a second adjacent address group of the latched address in response to the control signal.

Preferably, the counting part may count the smart refresh command and activate the control signal when the smart refresh command is counted the predetermined number of times.

Preferably, the address output part may output the first adjacent address group when the control signal is deactivated and output the second adjacent address group when the control signal is activated.

In an embodiment, a refresh operation method of a semiconductor memory device may include detecting a target word line of a plurality of word lines, performing a smart refresh operation for a first pair of word lines first adjacent to the target word line, among the plurality of word lines, for a predetermined number of times in response to a refresh command, and performing the smart refresh operation for a second pair of word lines second adjacent to the target word line, among the plurality of word lines, in response to the refresh command, after the performing of the smart refresh operation for the first pair of word lines.

Preferably, the refresh operation method may further include sequentially performing a normal refresh operation for the plurality of word lines in response to the refresh command.

The semiconductor memory device according to the present embodiment is able to improve the efficiency of a refresh operation and to substantially prevent the loss of data stored therein, thereby ensuring the reliability of the data.

DETAILED DESCRIPTION

Figure 1:
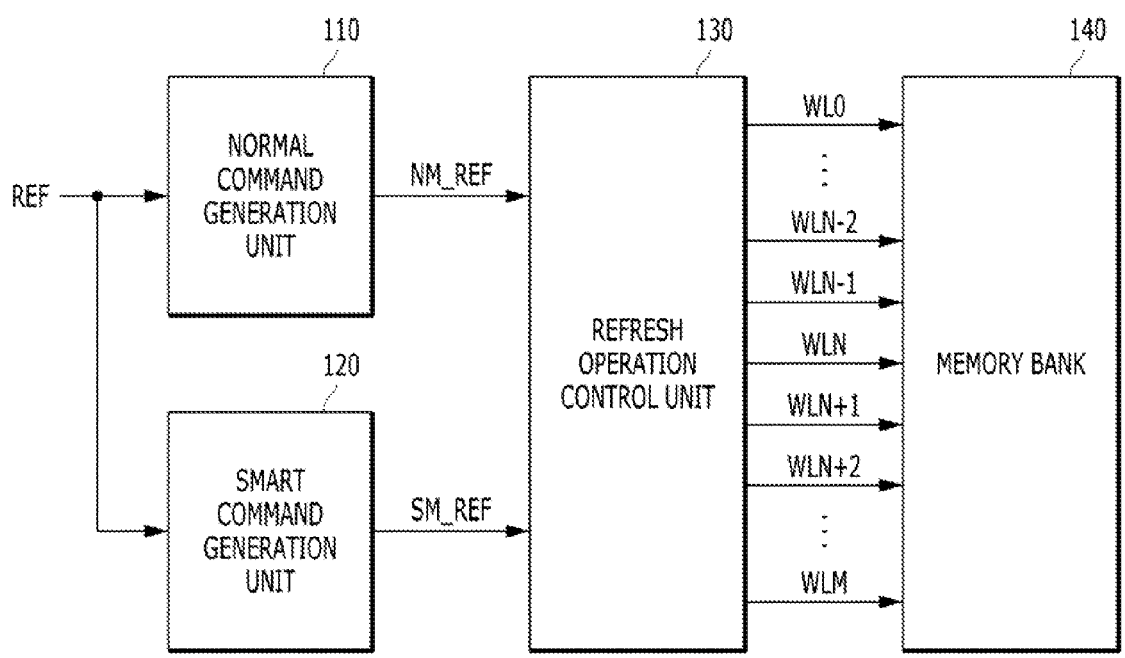
FIG. 1 is a diagram for explaining a semiconductor memory device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being on a second layer or "on" a substrate, it not only refers to where the first layer is formed directly on the second layer or the substrate but also to where a third layer exists between the first layer and the second layer or the substrate.

FIG. 1 is a block diagram illustrating a semiconductor memory device in accordance with an embodiment of the present invention.

Referring to FIG. 1, the semiconductor memory device may include a normal command generation unit 110, a smart command generation unit 120, a refresh operation control unit 130, and a memory bank 140.

The normal command generation unit 110 may generate a normal refresh command NM_REF in response to a refresh command REF. The refresh command REF may indicate a signal which is activated in a refresh operation.

The smart command generation unit 120 may count the refresh command REF and generate a smart refresh command SM_REF which is activated in a predetermined cycle.

The refresh operation control unit 130 may control a plurality of word lines WL0, ..., WLN−2, WLN−1, WLN, WLN+1, WLN+2, ..., and WLM (N and M are natural numbers) in response to the normal refresh command NM_REF and the smart refresh command SM_REF.

In response to the normal refresh command NM_REF, the refresh operation control unit 130 may sequentially access the plurality of word lines WL0, ..., WLN−2, WLN−1, WLN, WLN+1, WLN+2, ..., and WLM.

In response to the smart refresh command SM_REF, the refresh operation control unit 130 may access the first adjacent word lines WLN−1 and WLN+1 first adjacent to the target word line WLN or the second adjacent word lines WLN−2 and WLN+2 second adjacent to the target word line WLN among the plurality of word lines WL0, ..., WLN−2, WLN−1, WLN, WLN+1, WLN+2, ..., and WLM. The target word line WLN may indicate a word line that is activated frequently or with a high frequency. The target word line WLN may be updated whenever the refresh operation is performed.

The memory bank 140 includes a plurality of memory cells for storing a plurality of data, wherein the plurality of memory cells may be coupled to the plurality of word lines WL0, ..., WLN−2, WLN−1, WLN, WLN+1, WLN+2, ..., WLM, respectively.

Among the plurality of word lines WL0, ..., WLN−2, WLN−1, WLN, WLN+1, WLN+2, ..., and WLM, an activated word line may be subjected to the refresh operation.

Next, an operation of the semiconductor memory device will be described.

The semiconductor memory device may receive the refresh command REF. The normal command generation unit 110 and the smart command generation unit 120 may receive the refresh command REF. The normal command generation unit 110 may receive the refresh command REF and generate the normal refresh command NM_REF for a predetermined number of times. The smart command generation unit 120 may receive the refresh command REF and generate the smart refresh command SM_REF when the refresh command REF is inputted the predetermined number of times or more.

For example, if the normal refresh and smart refresh operations are assigned to be performed at the ratio of 3:1, the semiconductor memory device may perform the normal refresh operation three times and the smart refresh operation once while the refresh command REF is received four times. When the refresh command REF is received, the normal command generation unit 110 may activate the normal refresh command NM_REF and count the number of times the refresh command REF is received. In response to a fourth refresh command REF, the normal command generation unit 110 may deactivate the normal refresh command NM_REF. Meanwhile, the smart command generation unit 120 may count the number of times the refresh command REF is received, and activate the smart refresh command SM_REF in response to the fourth refresh command REF.

When the normal refresh command NM_REF is generated the refresh operation control unit 130 may receive and count the normal refresh command NM_REF, and control the plurality of word lines WL0, . . . , WLN−2, WLN−1, WLN, WLN+1, WLN+2, . . . , and WLM to be sequentially activated. A word line activated in the memory bank 140 may be subjected to the normal refresh operation.

When the smart refresh command SM_REF is generated, the refresh operation control unit 130 may count the smart refresh command SM_REF. The refresh operation control unit 130 may control the first adjacent word lines WLN−1 and WLN+1 of the target word line WLN to be activated until the smart refresh command SM_REF is counted a predetermined number of times. That is, the first adjacent word lines WLN−1 and WLN+1 of the target word line WLN are activated when the counted number of times of the smart refresh command SM_REF is less than the predetermined number of times. The refresh operation control unit 130 may control the second adjacent word lines WLN−2 and WLN+2 of the target word line WLN to be activated after the smart refresh command SM_REF is counted the predetermined number of times. That is, the second adjacent word lines WLN−2 and WLN+2 of the target word line WLN are activated when the counted number of times of the smart refresh command SM_REF is equal to or more than the predetermined number of times.

Consequently, in the semiconductor memory device in accordance with the embodiment of the present invention, the smart refresh operation may be performed for all the first adjacent word lines WLN−1 and WLN+1 of the target word line WLN, which is frequently accessed, and then the smart refresh operation may be performed for all the second adjacent word lines WLN−2 and WLN+2. Consequently, the semiconductor memory device may improve refresh operation efficiency and prevent loss of data stored therein, to ensure data reliability.

Figure 2:
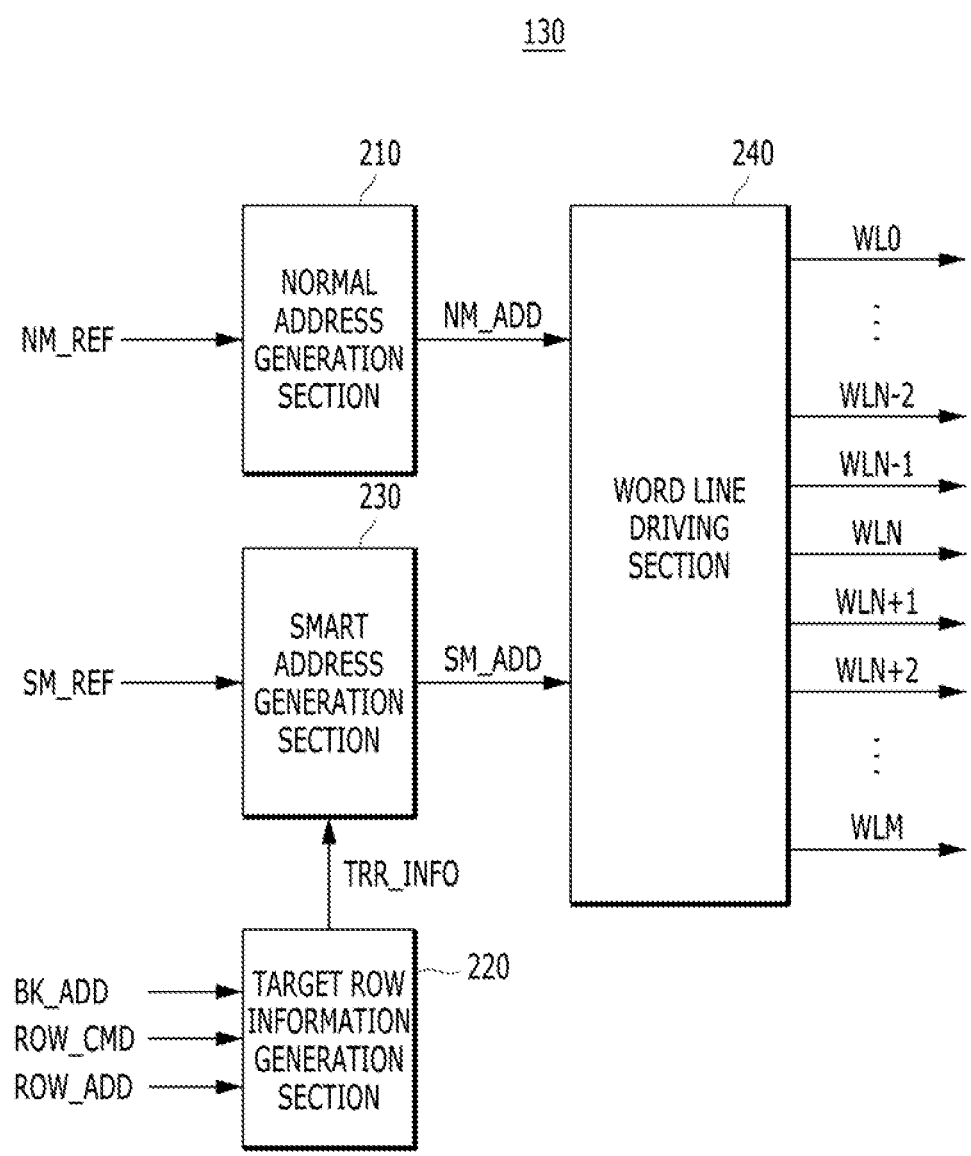
FIG. 2 is a block diagram of a refresh operation control unit illustrated in FIG. 1.

FIG. 2 is a block diagram for explaining an embodiment of the refresh operation control unit 130 illustrated in FIG. 1.

Referring to FIG. 2, the refresh operation control unit 130 may include a normal address generation section 210, a target row information generation section 220, a smart address generation section 230, and a word line driving section 240.

The normal address generation section 210 may receive the normal refresh command NM_REF. The normal address generation section 210 may count the normal refresh command NM_REF and output a normal refresh address NM_ADD such that the plurality of word lines WL0, . . . , WLN−2, WLN−1, WLN, WLN+1, WLN+2, . . . , and WLM may be sequentially accessed.

The target row information generation section 220 may receive a bank address BK_ADD, a row command ROW_CMD and a row address ROW_ADD. The target row information generation section 220 may recognize information on the target word line through the row command ROW_CMD and the row address ROW_ADD. The row address ROW_ADD may be activated in the normal refresh operation.

When the semiconductor memory device enters an active mode, the target row information generation section 220 may simultaneously receive the bank address BK_ADD the row command ROW_CMD, and the row address ROW_ADD. That is, the target row information generation section 220 may recognize the number of times the row address ROW_ADD has been activated in a bank corresponding to the bank address BK_ADD through the row command ROW_CMD and the row address ROW_ADD. This may indicate information on the number of times the row address ROW_ADD has been accessed.

The target row information generation section 220 may set an address having a large number of accesses as a target word line for the smart refresh operation. The target row information generation section 220 may output target row information TRR_INFO to the smart address generation section 230.

The smart address generation section 230 may receive the target row information TRR_INFO from the target row information generation section 220, and generate a smart refresh address SM_ADD for the smart refresh operation. The smart address generation section 230 may receive the smart refresh command SM_REF, and output first adjacent addresses of the target word line or second adjacent addresses of the target word line as the smart refresh address SM_ADD.

For example, when an address of the target word line WLN, for which an activation operation is frequently performed, is 'N', the first adjacent addresses may be addresses 'N−1' and 'N+1' of the two word lines WLN−1 and WLN+1 adjacent to the target word line WLN. The second adjacent addresses may be addresses 'N−2' and 'N+2' of the two word lines WLN−2 and WLN+2 second adjacent to the target word line WLN. Since the target row information TRR_INFO on the target word line is updated by the target row information generation section 220 and transferred to the smart address generation section 230, a target word line of the first adjacent addresses and a target word line of the second adjacent addresses may be different.

In response to the smart refresh command SM_REF, the smart address generation section 230 may count the number of times the smart refresh command SM_REF is received, and output the first adjacent addresses when the counted number of times does not reach a preset number of times. The smart address generation section 230 may output the second adjacent addresses for a predetermined number of times after the smart refresh command SM_REF is received the preset number of times.

In other words, the smart address generation section 230 may output the first adjacent addresses of the target word line, which corresponds to the target row information TRR_INFO updated by and received from the target row information generation section 220, depending on the number of times the smart refresh command SM_REF has been received. Then, the smart address generation section 230 may output the second adjacent addresses of the target word line, which corresponds to the target row information TRR_INFO updated by and received from the target row information generation section 220, while the number of times the smart refresh command SM_REF has been received is the preset number of times.

The word line driving section 240 may receive the normal refresh address NM_ADD from the normal address generation section 210. The word line driving section 240 may receive the smart refresh address SM_ADD, which is the first adjacent address or the second adjacent address, from the smart address generation section 230. The word line driving section 240 may drive word lines corresponding to the received addresses.

Figure 3:
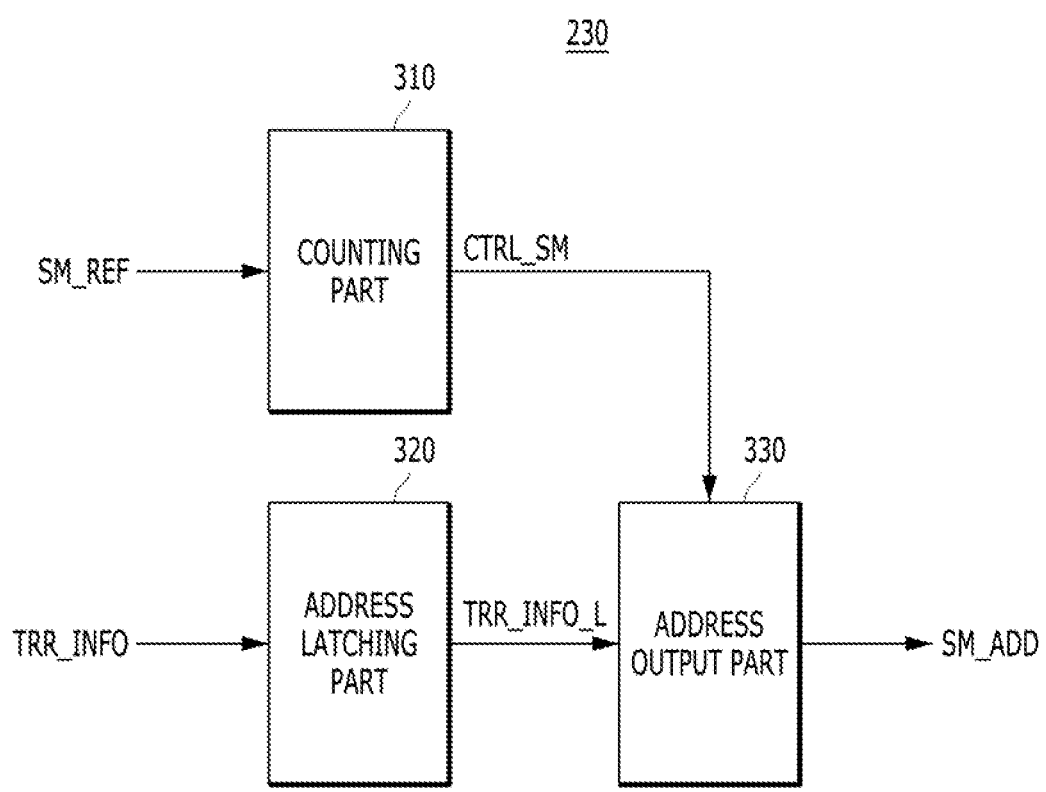
FIG. 3 is a block diagram of a smart address generation section illustrated in FIG. 2.

FIG. 3 is a block diagram for explaining an embodiment of the smart address generation section 230 illustrated in FIG. 2.

Referring to FIG. 3, the smart address generation section 230 may include a counting part 310, an address latching part 320, and an address output part 330.

The counting part 310 may receive the smart refresh command SM_REF and perform a counting operation. The counting part 310 may generate a control signal CTRL_SM when the number of times the smart refresh command SM_REF has been received is equal to or more than the preset number of times.

The address latching part 320 may receive and latch the target row information TRR_INFO. The address latching part 320 may output latched target row information TRR_INFO_L to the address output part 330.

The address output part 330 may receive the control signal CTRL_SM and the latched target row information TRR_INFO_L from the counting part 310 and the address latching part 320, respectively. When the control signal CTRL_SM is deactivated, the address output part 330 may receive the latched target row information TRR_INFO_L and output the first adjacent address as the smart refresh address SM_ADD. However, when the control signal CTRL_SM is activated, the address output part 330 may receive the latched target row information TRR_INFO_L and output the second adjacent address as the smart refresh address SM_ADD.

Figure 4:
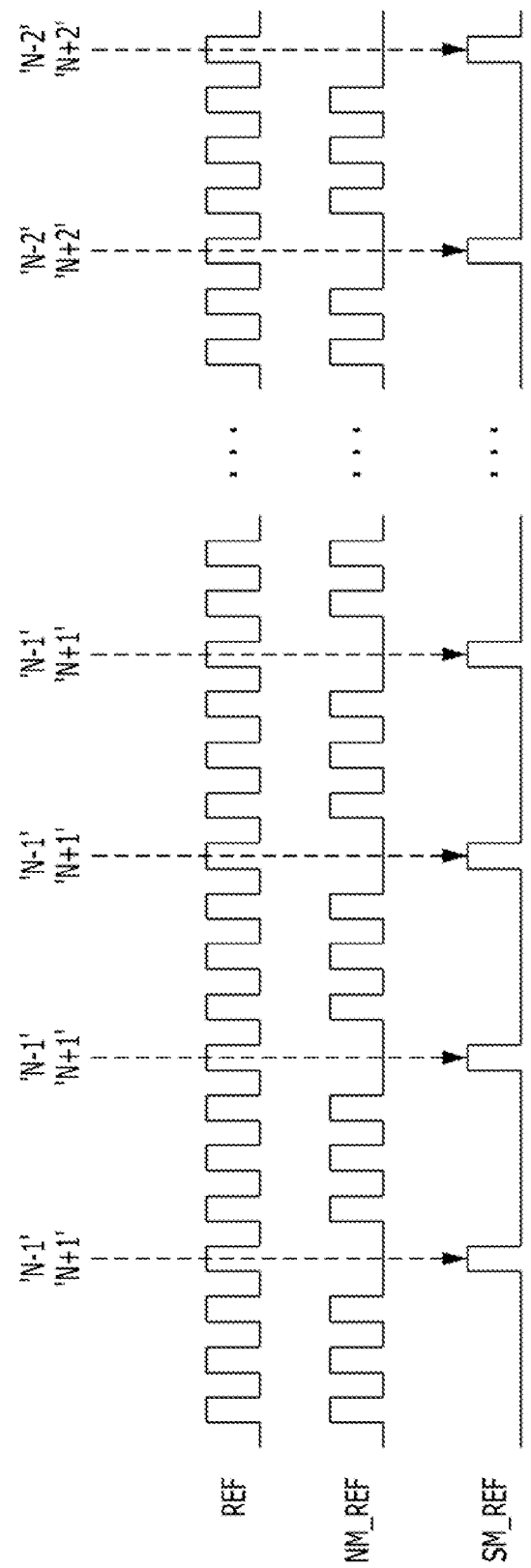
FIG. 4 is a waveform diagram illustrating an operation of a semiconductor memory device of FIG. 1.

FIG. 4 is a waveform diagram illustrating the operation of the semiconductor memory device of FIG. 1.

The normal refresh command NM_REF corresponding to the normal refresh operation and the smart refresh command SM_REF corresponding to the smart refresh operation may be activated in response to the refresh command REF.

For example, when the refresh command REF is received four times, the normal refresh operation may be performed three times and the smart refresh operation may be performed once. The smart refresh operation may be continuously performed for the first adjacent addresses 'N−1' and 'N+1' for a predetermined number of times. Then, when it reaches the predetermined number of times or more, the smart refresh operation may be continuously performed for the second adjacent addresses 'N−2' and 'N+2' response to the smart refresh command SM_REF.

In the semiconductor memory device in accordance with an embodiment of the present invention, it is possible to continuously perform refresh operations for first adjacent addresses of the first word lines that are closest to the target word line at a target row. Then, when the refresh operation is performed the preset number of times or more, it is possible to continuously perform refresh operations for the second adjacent addresses of the second word lines that are second closest to the target word line. Consequently, the refresh operation for the first adjacent addresses is ended, and then the refresh operation for the second adjacent addresses is performed, so that it is possible to prevent deterioration of the second word lines. Furthermore, the semiconductor memory device may improve efficiency of the refresh operations and prevent the loss of data stored therein, so that it is possible to ensure data reliability.

Although various embodiments have been described for illustrative purposes, it will be apparent to those skilled in the art that various changes and modifications may be made without departing from the spirit and scope of the invention as defined in the following claims.

In addition, the positions and types of logic gates and transistors demonstrated in the previous embodiments may implement in different manners depending on the polarity of input signals, etc.

What is claimed is:

1. A semiconductor memory device comprising:
a memory bank including a plurality of word lines;
a refresh operation control unit that performs a first refresh operation to a first adjacent word line group of a target word line of the plurality of word lines for at least two times, and performs a second refresh operation to a second adjacent word line group of the target word line for at least two times after the first refresh operation, in response to a smart refresh command;
a normal command generation unit that generates a normal refresh command in response to a refresh command; and
a smart command generation unit that counts the refresh command and generates the smart refresh command whenever the refresh command is counted a first predetermined number of times,
wherein the normal refresh command is deactivated when the smart refresh command is activated,
wherein the first adjacent word line group includes the $(N-1)^{th}$ and $(N+1)^{th}$ word lines and the second adjacent word line group includes the $(N-2)^{th}$ and $(N+2)^{th}$ word lines when the target word line corresponds to the $N^{th}$ word line,
wherein the normal command generation unit counts a refresh command and generates a normal refresh command which is activated in each predetermined cycle.

2. The semiconductor memory device of claim 1, wherein the first adjacent word line group includes a word line first adjacent to the target word line, and the second adjacent word line group includes a word line second adjacent to the target word line, among the plurality of word lines.

3. The semiconductor memory device of claim 1, wherein the smart command generation unit counts the refresh command to activate the smart refresh command for executing a first smart mode in each first predetermined cycle, and counts the refresh command to activate the smart refresh command for executing a second smart mode in each second predetermined cycle.

4. The semiconductor memory device of claim 1, wherein the refresh operation control unit sequentially accesses the plurality of word lines in response to the normal refresh command.

5. The semiconductor memory device of claim 1, wherein the refresh operation control unit comprises:
a normal address generation section that counts the normal refresh command and generating a normal refresh address;
a target row information generation section that receives a bank address, a row command, and a row address, and generating target row information on the target word line;
a smart address generation section that receives the smart refresh command and the target row information and generates a first adjacent address for the first adjacent word line group or a second adjacent address for the second word line group; and
a word line driving section that drives word lines corresponding to the normal refresh address and the first and second adjacent addresses, among the plurality of word lines.

6. The semiconductor memory device of claim 5, wherein the smart address generation section comprises:
a counting part that counts the smart refresh command and generating a control signal;
an address latching part that latches the target row information and outputting a latched address; and
an address output part that outputs a first adjacent address group of the latched address or a second adjacent address group of the latched address in response to the control signal.

7. The semiconductor memory device of claim 6, wherein the counting part counts the smart refresh command and activates the control signal when the smart refresh command is counted a second predetermined number of times.

8. The semiconductor memory device of claim 6, wherein the address output part outputs the first adjacent address group when the control signal is deactivated and outputs the second adjacent address group when the control signal is activated.

9. A semiconductor memory device comprising:
a memory bank including a plurality of word lines;
a smart command generation unit that counts a refresh command and generating a smart refresh command which is activated in a predetermined cycle;
a refresh operation control unit that counts the smart refresh command, performs a refresh operation to a first word lines most adjacent to a target word line of the plurality of word lines for at least two times, and performs the refresh operation to a second word lines second adjacent to the target word line for at least two times after the refresh operation of the first word lines; and
a normal command generation unit that generates a normal refresh command in response to the refresh command and deactivates the normal refresh command when the smart refresh command is activated
wherein the first word lines include the (N−1)$^{th}$ and (N+1)$^{th}$ word lines and the second word lines include the (N−2)$^{th}$ and (N+2)$^{th}$ word lines when the target word line corresponds to the N$^{th}$ word line,
wherein the refresh operation control unit comprises:
a normal address generation section that counts the normal refresh command and generating a normal refresh address;
a target row information generation section that receives a bank address, a row command, and a row address, and generating target row information on the target word line;
a smart address generation section that receives the smart refresh command and the target row information and generates a first adjacent address for the first word line or
a second adjacent address for the second word line; and
a word line driving section that drives word lines corresponding to the normal refresh address and the first and second adjacent addresses, among the plurality of word lines.

10. The semiconductor memory device of claim 9, wherein the smart address generation section comprises:
a counting part that counts the smart refresh command and generating a control signal;
an address latching part that latches the target row information and outputting a latched address; and
an address output part that outputs a first adjacent address group of the latched address or a second adjacent address group of the latched address in response to the control signal.

11. The semiconductor memory device of claim 10, wherein the counting part counts the smart refresh command and activates the control signal when the smart refresh command is counted a predetermined number of times.

12. The semiconductor memory device of claim 10, wherein the address output part outputs the first adjacent address group when the control signal is deactivated and outputs the second adjacent address group when the control signal is activated.

13. A refresh operation method of a semiconductor memory device, comprising:
detecting a target word line of a plurality of word lines;
performing a smart refresh operation to a first pair of word lines first adjacent to the target word line, among the plurality of word lines, for at least two times in response to a refresh command; and
performing the smart refresh operation to a second pair of word lines second adjacent to the target word line, among the plurality of word lines for at least two times, in response to the refresh command, after the performing of the smart refresh operation for the first pair of word lines;
sequentially performing a normal refresh operation for the plurality of word lines in response to the refresh command,
wherein the first pair of word lines include the (N−1)$^{th}$ and (N+1)$^{th}$ word lines and the second pair of word lines include the (N−2)$^{th}$ and (N+2)$^{th}$ word lines when the target word line corresponds to the N$^{th}$ word line
wherein the smart refresh operation is performed in response to a smart refresh command whenever the refresh command is counted a first predetermined number of times,
wherein the normal refresh operation is deactivated when the smart refresh command is activated,
wherein the normal refresh operation is performed in response to a normal refresh command generated by counting a refresh command and generates a normal refresh command and the normal refresh command is activated in each predetermined cycle.

14. The refresh operation method of claim 13, further comprising:

updating the target word line whenever the smart refresh operation is performed.

* * * * *